(12) United States Patent
Bak et al.

(10) Patent No.: US 12,463,020 B2
(45) Date of Patent: Nov. 4, 2025

(54) SUPPORT UNIT, APPARATUS FOR TREATING SUBSTRATE WITH THE SAME

(71) Applicant: SEMES CO., LTD., Cheonan-si (KR)

(72) Inventors: Yun Seok Bak, Seongnam-si (KR); Hyung Joon Kim, Pyeongtaek-si (KR)

(73) Assignee: SEMES CO., LTD., Cheonan-si (KR)

( * ) Notice: Subject to any disclaimer, the term of this patent is extended or adjusted under 35 U.S.C. 154(b) by 578 days.

(21) Appl. No.: 17/874,200

(22) Filed: Jul. 26, 2022

(65) Prior Publication Data

US 2023/0030464 A1     Feb. 2, 2023

(30) Foreign Application Priority Data

Jul. 28, 2021    (KR) ........................ 10-2021-0099364

(51) Int. Cl.
    *H01J 37/32*          (2006.01)
    *H01J 37/34*          (2006.01)
    (Continued)

(52) U.S. Cl.
    CPC .. *H01J 37/32642* (2013.01); *H01J 37/32715* (2013.01); *H01J 37/32807* (2013.01);
    (Continued)

(58) Field of Classification Search
    CPC .......... H01J 37/32715; H01J 37/32642; H01J 37/32807; H01J 37/32605;
    (Continued)

(56) References Cited

U.S. PATENT DOCUMENTS

2017/0362712 A1* 12/2017 Yadav .................... G01J 5/0007
2019/0013232 A1*  1/2019 Yan ......................... H01J 37/20
(Continued)

FOREIGN PATENT DOCUMENTS

KR     1020080023569       3/2008
KR     1020160088820       7/2016
(Continued)

OTHER PUBLICATIONS

Office Action from the Korean Intellectual Property Office dated Mar. 6, 2023.

*Primary Examiner* — Gordon Baldwin
*Assistant Examiner* — Todd M Seoane

(57) ABSTRACT

The inventive concept provides a substrate treating apparatus. The substrate treating apparatus includes a housing having a treating space treating a substrate; a support unit supporting the substrate at the treating space; a gas supply unit supplying a process gas into the treating space; and a plasma source generating a plasma from the process gas, and wherein the support unit comprises: a dielectric plate placing the substrate on a top surface thereof; a top ring surrounding a circumference of a substrate placed on the dielectric plate; a temperature sensor measuring a temperature of the top ring; a first lifting/lowering member lifting/lowering the top ring; and a controller, and wherein the controller controls the first lifting/lowering member to change a height of the top ring according to an etching amount of the top ring calculated based on the temperature of the top ring measured by the temperature sensor.

15 Claims, 8 Drawing Sheets

(51) Int. Cl.
  *H01L 21/66*     (2006.01)
  *H01L 21/67*     (2006.01)
  *H01L 21/683*    (2006.01)
  *H01L 21/687*    (2006.01)
  *H01L 21/3065*   (2006.01)

(52) U.S. Cl.
  CPC .... *H01J 37/3482* (2013.01); *H01L 21/67248* (2013.01); *H01L 21/68735* (2013.01); *H01L 21/68742* (2013.01); *H01L 21/6875* (2013.01); *H01L 22/26* (2013.01); *H01J 37/3244* (2013.01); *H01J 2237/334* (2013.01); *H01L 21/3065* (2013.01); *H01L 21/6833* (2013.01)

(58) Field of Classification Search
  CPC ............. H01J 37/32614; H01J 37/3482; H01J 37/3244; H01J 2237/334; H01L 21/3065; H01L 21/68735; H01L 21/68742; H01L 21/6875; H01L 22/26; H01L 21/67248; H01L 21/6833; C23C 16/4585
  See application file for complete search history.

(56) References Cited

U.S. PATENT DOCUMENTS

2019/0326092 A1* 10/2019 Ogasawara ....... H01J 37/32091
2020/0118796 A1*  4/2020 Arakelyan .......... H01L 21/6831
2020/0176228 A1*  6/2020 Oka ................. H01J 37/32449

FOREIGN PATENT DOCUMENTS

KR   10-2016-0145865    12/2016
KR   10-2021-0003984     1/2021

* cited by examiner

SUPPORT UNIT, APPARATUS FOR TREATING SUBSTRATE WITH THE SAME

CROSS-REFERENCE TO RELATED APPLICATIONS

A claim for priority under 35 U.S.C. § 119 is made to Korean Patent Application No. 10-2021-0099364 filed on Jul. 28, 2021, in the Korean Intellectual Property Office, the entire contents of which are hereby incorporated by reference.

BACKGROUND

Embodiments of the inventive concept described herein relate to a support unit and a substrate treating apparatus including the same, more specifically, a substrate treating apparatus for plasma treating a substrate and a substrate support unit used in the same.

A plasma refers to an ionized gas state composed of ions, radicals, and electrons. The plasma is produced by a very high temperatures, a strong electric field, or a high frequency electromagnetic field (RF electromagnetic field). A semiconductor device manufacturing process may include an etching process of removing a thin film formed on a substrate such as a wafer using the plasma. The etching process is performed by colliding ions and/or radicals of the plasma with the thin film on the substrate or reacting with the thin film.

A substrate treating apparatus using the plasma includes a process chamber, a support assembly supporting the substrate in the process chamber, and a plasma source for generating the plasma from a gas for treating the substrate. The support assembly includes an electrostatic chuck fixing the substrate by an electrostatic force and a focus ring surrounding an outer circumference of the substrate seated on the electrostatic chuck.

The focus ring distributes the plasma with a high uniformly on a surface of the substrate. The focus ring allows the plasma to be concentrated in a region facing the substrate in the process chamber. When an etching is repeatedly performed on the substrate, the focus ring is also etched, and thus a form of the focus ring is gradually changed. Due to such a change in the form of the focus ring, the plasma is not concentrated on the substrate, which changes etching characteristics for the substrate. Therefore, by repeatedly performing the etching on the substrate, if the form of the focus ring is changed and it is determined that it is outside an allowable range, the focus ring is replaced. If the focus ring reaches a critical point of use, a replacement of the focus ring should be made at a correct time.

Accordingly, it is important in a plasma treatment process to determine an etching degree of the focus ring. To this end, there are various attempts, such as determining the etching degree of the focus ring by irradiating a light from above of the focus ring, but such a method can measure only the etching degree for a part of an entire area of the focus ring. That is, a total etching amount of the focus ring is only estimated based on the etching degree for a partial area of the focus ring. Accordingly, it is difficult to accurately determine the etching degree of the focus ring. Furthermore, a problem of missing a replacement period of the focus ring occurs, and accordingly, the plasma is not concentrated on the substrate, thereby causing a process defect.

SUMMARY

Embodiments of the inventive concept provide a support unit for accurately calculating an etching degree of a focus ring and lifting and lowering the focus ring according to the etching degree, and a substrate treating apparatus and method including the same.

Embodiments of the inventive concept provide a support unit for determining an etching degree of a focus ring in real time and lifting and lowering the focus ring according to the etching degree, and a substrate treating apparatus and method including the same.

Embodiments of the inventive concept provide a support unit for forming a uniform plasma on a substrate by adjusting a height of a focus ring in real time, and a substrate treating apparatus and method including the same.

The technical objectives of the inventive concept are not limited to the above-mentioned ones, and the other unmentioned technical objects will become apparent to those skilled in the art from the following description.

The inventive concept provides a substrate treating apparatus. The substrate treating apparatus includes a housing having a treating space treating a substrate; a support unit supporting the substrate at the treating space; a gas supply unit supplying a process gas into the treating space; and a plasma source generating a plasma from the process gas, and wherein the support unit comprises: a dielectric plate placing the substrate on a top surface thereof; a top ring surrounding a circumference of a substrate placed on the dielectric plate; a temperature sensor measuring a temperature of the top ring; a first lifting/lowering member lifting/lowering the top ring; and a controller, and wherein the controller controls the first lifting/lowering member to change a height of the top ring according to an etching amount of the top ring calculated based on the temperature of the top ring measured by the temperature sensor.

The inventive concept provides a support unit supporting a substrate at a treating space for plasma treating the substrate. The support unit includes a dielectric plate placing the substrate on a top surface; a top ring surrounding a circumference of the substrate placed on the dielectric plate; a temperature sensor measuring a temperature of the top ring; a first lifting/lowering member lifting/lowering the top ring; and a controller for controlling the first lifting/lowering member, and wherein the controller controls the first lifting/lowering member to change a height of the top ring according to an etching amount of the top ring calculated based on a temperature of the top ring measured at the temperature sensor.

The inventive concept provides a substrate treating method. The substrate treating method includes changing a height of a first ring member surrounding a substrate according to an etching amount of the first ring member during a plasma process, and wherein the etching amount of the first ring member is calculated based on a measured temperature of the first ring member which is measured by contacting the first ring member with a temperature sensor.

According to an embodiment of the inventive concept, a height of a focus ring may be adjusted according to an etching degree by accurately calculating the etching degree of the focus ring.

According to an embodiment of the inventive concept, an etching degree of a focus ring may be determined in real time to lift and lower the focus ring according to the etching degree.

According to an embodiment of the inventive concept, a uniform plasma may be formed on a substrate by adjusting a height of a focus ring in real time.

According to an embodiment of the inventive concept, an efficiency of a substrate treatment may be increased by extending a replacement period of a focus ring.

According to an embodiment of the inventive concept, a focus ring and a ring member surrounding the focus ring may be independently maintained.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
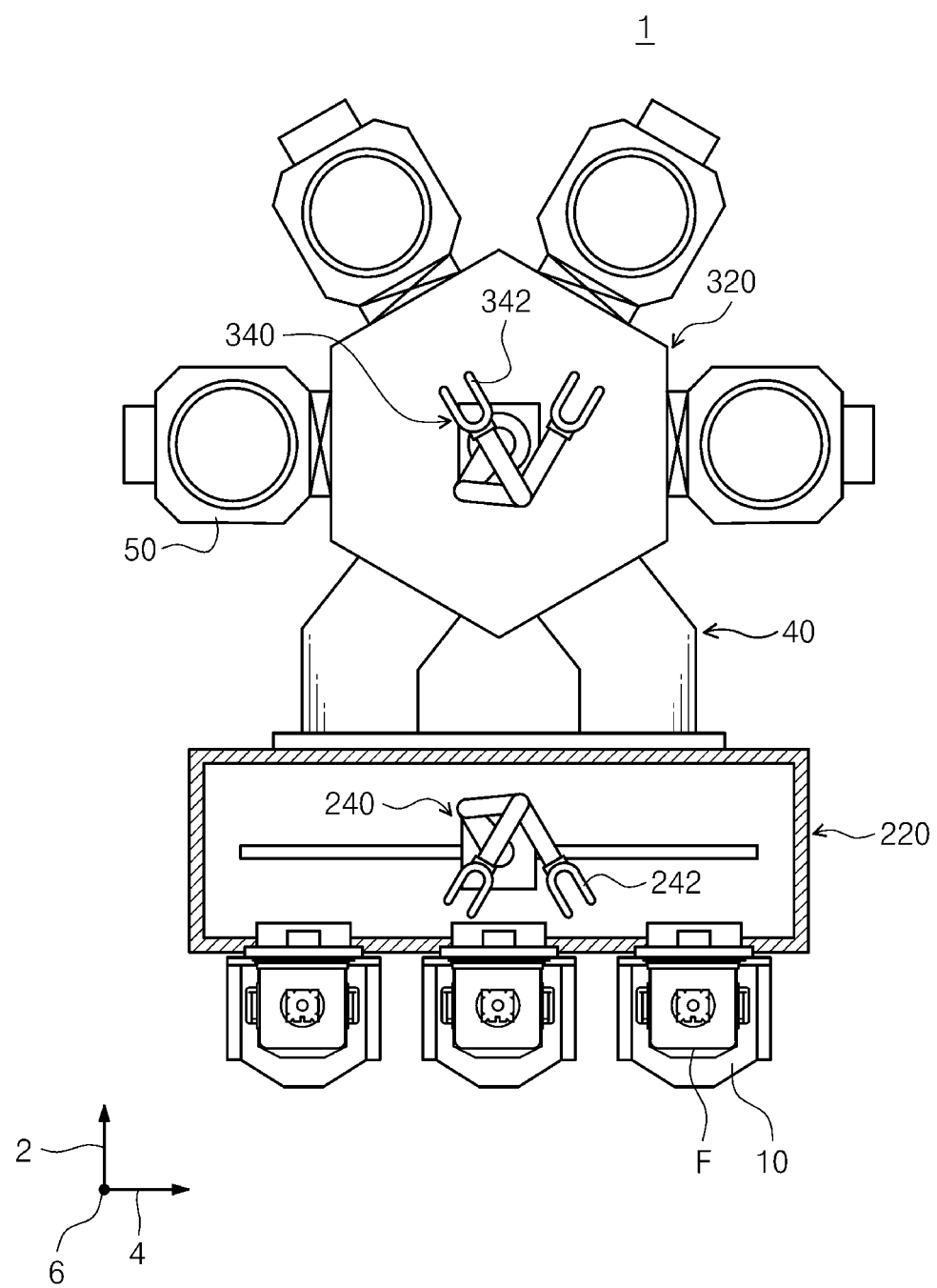
FIG. 1 schematically illustrates a substrate treating apparatus according to an embodiment of the inventive concept.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Hereinafter, an embodiment of the inventive concept will be described in detail with reference to FIG. 1 to FIG. 9.

FIG. 1 schematically illustrates a substrate treating apparatus according to an embodiment of the inventive concept. Referring to FIG. 1, the substrate treating apparatus 1 according to an embodiment of the inventive concept may include a load port 10, an atmospheric pressure transfer module 20, a vacuum transfer module 30, a load lock chamber 40, and a process chamber 50.

The load port 10 may be disposed on a side of the atmospheric pressure transfer module 20 to be described later. One or more load ports 10 may be provided. The number of load ports 10 may increase or decrease according to a process efficiency, foot print conditions, and the like. A container F according to an embodiment of the inventive concept may be placed in the load port 10. The container F may be loaded onto or unloaded from the load port 10 by a transfer means (not shown) such as an overhead transfer apparatus (OHT), an overhead conveyor, or an automatic guided vehicle, or by an operator. The container F may include various types of containers according to a type of an article to be stored. As the container F, an airtight container such as a front opening integrated pod (FOUP) may be used.

The atmospheric pressure transfer module 20 and the vacuum transfer module 30 may be arranged in a first direction 2. Hereinafter, when viewed from above, a direction perpendicular to the first direction 2 is defined as a second direction 4. In addition, a direction perpendicular to a plane including both the first direction 2 and the second direction 4 is defined as a third direction 6. Here, the third direction 6 is a direction perpendicular to the ground.

The atmospheric pressure transfer module 20 may selectively transfer the substrate W or the ring member 600 between the container F and the load lock chamber 40 to be described later. For example, the atmospheric pressure transfer module 20 may take out the substrate W from the container F and transfer the substrate W to the load lock chamber 40, or may take out the substrate W from the load lock chamber 40 and transfer the substrate W to the container F. The atmospheric pressure transfer module 20 may include a transfer frame 220 and a first transfer robot 240. The transfer frame 220 may be provided between the load port 10 and the load lock chamber 40. That is, the load port 10 may be connected to the transfer frame 220. The transfer frame 220 may be provided with an atmospheric pressure therein. An inside of the transfer frame 220 may be maintained in an atmospheric pressure atmosphere.

The transfer frame 220 may be provided with a first transfer robot 240. The first transfer robot 240 may selectively transfer the substrate W or the ring member 600 between the container F seated on the load port 10 and the load lock chamber 40 to be described later.

The first transfer robot 240 may move in a up/down direction. The first transfer robot 240 may have a first transfer hand 242 that moves forwardly, backwardly, or rotates on a horizontal plane. One or a plurality of first transfer hands 242 of the first transfer robot 240 may be provided. The substrate W may be placed on the first transfer hand 242. The first transfer hand 242 may transfer each of the top ring 620 and the cover ring 660 to be described later. Selectively, a ring carrier (not shown) to be described later supporting the ring member 600 may be placed on the first transfer hand 242. Selectively, the first transfer hand 242 may directly support the ring member 600. The ring member 600 may be placed on the first transfer hand 242.

The vacuum transfer module 30 may be disposed between a load lock chamber 40 to be described later and a process chamber 50 to be described later. The vacuum transfer module 30 may include a transfer chamber 320 and a second transfer robot 340.

The transfer chamber 320 may maintain an inner atmosphere as a vacuum pressure atmosphere. The transfer chamber 320 may be provided with a second transfer robot 340. In an embodiment, the second transfer robot 340 may be located in a central area of the transfer chamber 320. The second transfer robot 340 may selectively transfer the substrate W or the ring member 600 between the load lock chamber 40 and the process chamber 50. Selectively, the vacuum transfer module 30 may transfer the substrate W between the process chambers 50. The second transfer robot 340 may move in a horizontal and vertical direction. The second transfer robot 340 may have a second transfer hand 342 that moves forwardly, backwardly, or rotates on a horizontal plane. At least one second transfer hand 342 of the second transfer robot 340 may be provided.

At least one process chamber 50 to be described later may be connected to the transfer chamber 320. The transfer chamber 320 may be provided in a polygonal shape. A load lock chamber 40 and a process chamber 50 may be disposed around the transfer chamber 320. For example, as shown in FIG. 1, a hexagonal shaped transfer chamber 320 may be disposed at a central area of the vacuum transfer module 30, and a load lock chamber 40 and a process chamber 50 may be disposed around the transfer chamber 320. However, a shape of the transfer chamber 320 and the number of process chambers may be variously modified and provided according to the needs of a user.

The load lock chamber 40 may be disposed between the transfer frame 220 and the transfer chamber 320. The load lock chamber 40 provides a buffer space B in which the substrate W or the ring member 600 is exchanged between the transfer frame 220 and the transfer chamber 320. In an embodiment, to replace the ring member 600 disposed at the process chamber 50, the ring member 600 used at the process chamber 50 may temporarily remain at the load lock chamber 40. In an embodiment, in order to transfer a new ring member 600 scheduled to replace an old ring member 600 to the process chamber 50, the new ring member 600 may temporarily remain at the load lock chamber 40.

As mentioned above, an inner atmosphere of the transfer frame 220 may be maintained in an atmospheric pressure atmosphere, and the inner atmosphere of the transfer chamber 320 may be maintained in a vacuum pressure atmosphere. The load lock chamber 40 is disposed between the transfer frame 220 and the transfer chamber 320, so that an inner atmosphere thereof may be converted between the atmospheric pressure atmosphere and a vacuum pressure atmosphere.

At least one process chamber 50 may be connected to the transfer chamber 320. A plurality of process chambers 50 may be provided. The process chamber 50 may be a chamber that performs a process on the substrate W. The process chamber 50 may be a plasma chamber that treats the substrate W using a plasma. For example, the process chamber 50 may be a chamber performing an etching process of removing a thin film on the substrate W using the plasma, an ashing process of removing a photoresist film, a deposition process of forming a thin film on the substrate W, or a dry cleaning process. However, the inventive concept is not limited thereto, and a plasma treatment process performed at the process chamber 50 may be variously modified to a known plasma treatment process.

Figure 2:
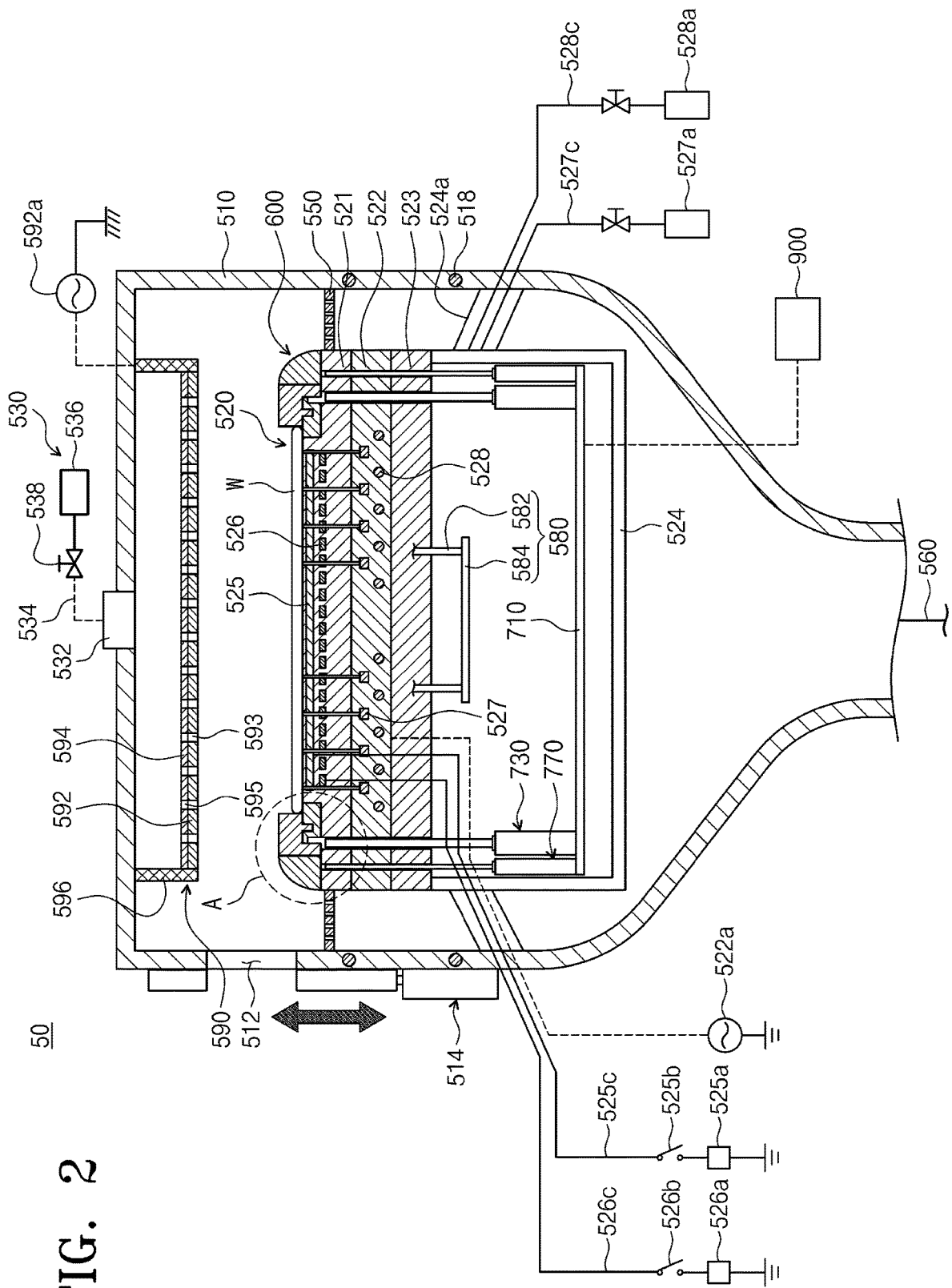
FIG. 2 schematically illustrates an embodiment of a process chamber of FIG. 1.

FIG. 2 schematically illustrates an embodiment of a process chamber of FIG. 1. Referring to FIG. 2, the process chamber 50 may treat a substrate W by transferring a plasma to the substrate W. The process chamber 50 may include a housing 510, a support unit 520, a gas supply unit 530, and a plasma source 540.

The housing 510 provides a treating space in which a substrate treating space is performed. The housing 510 may be provided in a sealed shape. When treating the substrate W, the treating space of the housing 510 may be generally maintained in a vacuum atmosphere. The housing 510 may be formed of a metal material. In an embodiment, the housing 510 may be made of an aluminum material. The housing 510 may be grounded. The substrate W and an inlet 512 through which a ring member 600 is carried in or out may be formed on a side of the housing 510. The inlet 512 may be selectively opened and closed by a gate valve 514.

An exhaust hole 516 may be formed at the bottom surface of the housing 510. An exhaust line 560 may be connected to the exhaust hole 516. The exhaust line 560 may exhaust a process gas, process by-products, and the like supplied to the treating space of the housing 510 through the exhaust hole 516. An exhaust baffle 550 may be provided above the exhaust hole 516 to allow a more uniform exhaust of the treating space. When viewed from above, the exhaust baffle 550 may have a generally ring shape. In addition, at least one hole may be formed at the exhaust baffle 550.

A heater 518 is provided on a wall of the housing 510. The heater 518 heats a wall of the housing 510. The heater 518 is electrically connected to a heating power source (not shown). The heater 518 generates a heat by resisting a current applied from a heating power source (not shown). The heat generated from the heater 518 is transferred to the treating space to maintain the treating space at a predetermined temperature. The heater 518 may be provided as a coil-shaped heating wire. A plurality of heaters 518 may be provided on the wall of the housing 510.

The support unit 520 is located within the housing 510. The support unit 520 may be provided to be upwardly spaced apart from a bottom surface of the housing 510. The support unit 520 supports the substrate W. The support unit 520 includes an electrostatic chuck that adsorbs the substrate W using an electrostatic force. In contrast, the support unit 520 may support the substrate W in various ways such as a vacuum adsorption or a mechanical clamping. Hereinafter, the support unit 520 including the electrostatic chuck will be described.

The support unit 520 may include a dielectric plate 521, an electrode plate 522, an insulating plate 523, a bottom body 524, a ring member 500, a lifting/lowering member 700, and a controller 900. The dielectric plate 521 is located at the top end of the support unit 520. The dielectric plate 521 receives an external power and applies the electrostatic force to the substrate W. The dielectric plate 521 may be provided as a disk-shaped dielectric substance. The substrate W is placed on a top surface of the dielectric plate 521. The top surface of the dielectric plate 521 has a smaller radius than that of the substrate W. When the substrate W is placed on the top surface of the dielectric plate 521, an edge area of the substrate W is located outside the dielectric plate 521.

An electrode 525 and a heater 526 are buried within the dielectric plate 521. The electrode 525 may be positioned above the heater 526.

The electrode 525 is electrically connected to a first power source 525a. The first power source 525a may include a DC power source. A first switch 525b is installed between the electrode 525 and the first power source 525a. The electrode 525 may be electrically connected to the first power source 525a by on/off of the first switch 525b. When the first switch 525b is turned on, a DC current is applied to the electrode 525. The electrostatic force acts between the electrode 525 and the substrate W by a current applied to the electrode 525. Accordingly, the substrate W is adsorbed on the dielectric plate 521.

The heater 526 is electrically connected to a second power source 526a. A second switch 526b may be installed between the heater 526 and the second power source 526a. The heater may be electrically connected to the second power source 526a by an on/off of the second switch 526b. The heater 526 generates a heat by resisting a current applied from the second power source 526a. A generated heat is transferred to the substrate W through the dielectric plate 521. The substrate W may be maintained at a predetermined temperature by the heat generated from the heater 526. The heater 526 may include a spiral coil. A plurality of heaters 526 are provided. The heater 526 may be provided in different regions of the dielectric plate 521. For example, a heater 526 for heating a central region of the dielectric plate 521 and a heater 526 for heating an edge region of the dielectric plate 521 may be provided, and the heaters 526 may be independently controlled from each other.

In the above-described example, the heater 526 is provided within the dielectric plate 521, but the inventive concept is not limited thereto, and the heater 526 may not be provided within the dielectric plate 521.

The electrode plate 522 is located under the dielectric plate 521. The electrode plate 522 may be provided in a disk shape. The electrode plate 522 may be made of a conductive material. In an embodiment, the electrode plate 522 may be made of an aluminum material. A top central region of the electrode plate 522 may have an area corresponding to a bottom surface of the dielectric plate 521.

The electrode plate 522 may include a metal plate. According to an embodiment, an entire area of the electrode plate 522 may be provided as a metal plate. The electrode plate 522 may be electrically connected to a third power source 522b. The third power source 522b may be provided as a high frequency power source generating a high frequency power. The high frequency power source may be provided as an RF power source. The RF power source may be provided as a high bias power RF power source. The electrode plate 522 receives the high frequency power from the third power source 522a. For this reason, the electrode plate 522 may function as an electrode. The electrode plate 522 may be provided to be grounded. In an embodiment, the electrode plate 522 may function as a bottom electrode.

A top fluid channel 527 and a bottom fluid channel 528 may be provided within the electrode plate 522. The top fluid channel 527 is provided as a passage through which a heat transfer medium circulates. The top fluid channel may be formed in a spiral shape within the electrode plate 522. The top fluid channel 527 is connected to a first fluid supply source 527a through a first fluid supply line 527c. The heat transfer medium is stored at the first fluid supply source 527a. The heat transfer medium may include an inert gas. In an embodiment, the heat transfer medium may be provided as a helium (He) gas. The helium gas is supplied to the top fluid channel 527 through the first fluid supply line 527c. The helium gas is supplied to a bottom surface of the substrate W through the top fluid channel 527. The helium gas may serve as a medium through which a heat transferred from the plasma to the substrate W is transferred to the dielectric plate 521 and the ring member 600.

The bottom fluid channel 528 is provided as a passage through which the heat transfer medium circulates. The electrode plate 522 may be formed in a spiral shape. The bottom fluid channel 528 is connected to a second fluid supply source 528a through the second fluid supply line 528c. The heat transfer medium is stored in the second fluid supply source 528a. The heat transfer medium may be provided as a cooling fluid. In an embodiment, the cooling fluid may be provided as a cooling water. The cooling water is supplied to the bottom fluid channel 528 through the second fluid supply line 528c. The cooling water flows through the bottom fluid channel 528 and may cool the electrode plate 522.

An insulating plate 523 is provided under the electrode plate 522. The insulating plate 523 is made of an insulating material, and electrically insulates the electrode plate 522 from a bottom body 524 to be described later. The insulating plate 523 may be provided in a circular plate shape when viewed from above. The insulating plate 523 may be provided with an area corresponding to that of the electrode plate 522.

The bottom body 524 is provided under the electrode plate 522. The bottom body 524 may be provided under the insulating plate 523. The bottom body 524 may be provided in a ring shape when viewed from above. A lifting/lowering module 580 to be described later and a lifting/lowering member 700 to be described later may be positioned within an inner space of the bottom body 524.

The bottom body 524 has a connecting member 524a. The connecting member 524a connects an outer surface of the bottom body 524 with an inner sidewall of the housing 510. A plurality of connecting members 524a may be provided on the outer surface of the bottom body 524 at regular intervals. The connecting member 524a supports the support unit 520 within the housing 510. In addition, the connecting member 524a is connected to the inner sidewall of the housing 510, so that the bottom body 524 is electrically grounded. A first power line 525c connected to the first power source 525a, a second power line 526c connected to the second power source 526a, a first fluid supply line 527d connected to the top fluid channel 527, a second fluid supply line 528c connected to the bottom fluid channel 528, and the like extends to an outside of the housing 510 through an inner space of the connecting member 524a.

The gas supply unit 530 supplies a process gas to the treating space of the housing 510. The gas supply unit 530 may include a gas supply nozzle 532, a gas supply line 534, and a gas storage unit 536. The gas supply nozzle 532 may be installed in a central area of a top surface of the housing 510. An injection hole is formed on a bottom surface of the gas supply nozzle 532. The injection hole supplies the process gas into the housing 510. The gas supply line 534 connects the gas supply nozzle 532 and the gas storage unit 536. The gas supply line 534 supplies a process gas stored at the gas storage unit 536 to the gas supply nozzle 532. A valve 538 is installed at the gas supply line 534. The valve 538 may adjust a flow rate of the process gas supplied through the gas supply line 534 by opening and closing the gas supply line 534.

The plasma source 540 excites the process gas in the housing 510 into a plasma state. In an embodiment of the inventive concept, a capacitively coupled plasma (CCP) is used as the plasma source. However, the present invention is not limited thereto, and the process gas in the housing 510 may be excited in a plasma state by using an inductively coupled plasma (ICP) or a microwave plasma. Hereinafter, a case in which the capacitive coupled plasma (CCP) is used as the plasma source will be described as an example.

The capacitively coupled plasma source may include a top electrode and a bottom electrode within the housing 510. The top electrode and the bottom electrode may be vertically disposed parallel to each other within the housing 510. One of both electrodes may apply a high frequency power, and the other electrode may be grounded. Unlike this, both electrodes may apply a high frequency power. An electromagnetic field is formed in a space between both electrodes, and the process gas supplied to the space may be excited in the plasma state. A substrate treatment process is performed using the plasma.

According to an embodiment, the top electrode may be provided as a shower head unit 590 to be described later, and the bottom electrode may be provided as the aforementioned metal plate. A high frequency power may be applied to the bottom electrode, and the top electrode may be grounded. In an embodiment, the high frequency power may be applied to the top electrode and the bottom electrode, respectively. For this reason, an electromagnetic field is generated between the top electrode and the bottom electrode. The generated electromagnetic field excites the process gas provided within the housing 510 into the plasma state.

The lifting/lowering module 580 may lift and lower the substrate W. The lifting/lowering module 580 may include a lifting/lowering pin 582, a lifting/lowering plate 584, and a lifting/lowering pin driver (not shown). The lifting/lowering pin 582 may be coupled to the lifting/lowering plate 584. The lifting/lowering plate 584 may be moved in the up/down direction by the lifting/lowering pin driver (not shown).

A shower head unit 590 may include a shower head 592, a gas injection plate 594, and a support part 596. The shower head 592 may be positioned to be downwardly spaced apart from the top surface of the housing 510 by a predetermined distance. A certain space may be formed between the gas injection plate 594 and the top surface of the housing 510. The shower head 592 may be provided in a plate shape having a constant thickness. A bottom surface of the shower head 592 may be anodized to prevent a generation of an arc due to the plasma. A cross section of the shower head 592 may be provided to have a same form and a cross-sectional area as the support unit 520. The shower head 592 includes a plurality of through holes 593. A through hole 593 penetrates a top surface and the bottom surface of the shower head 592 in the up/down direction. The shower head 592 may include a metal material. The shower head 592 may be electrically connected to a fourth power source 592a. The fourth power source 592a may be provided as a high frequency power source. In an embodiment, the shower head 592 may be electrically grounded. In an embodiment, the shower head 592 may function as a top electrode.

The gas injection plate 594 may be located on a top surface of the shower head 592. The gas injection plate 594 may be positioned to be upwardly spaced apart from the top surface of the housing 510 by a predetermined distance. The gas injection plate 594 may be provided in a plate shape having a constant thickness. The gas injection plate 594 is provided with an injection hole 595. The injection hole 595 penetrates the top surface and the bottom surface of the gas injection plate 594 in the up/down direction. The injection hole 595 is positioned opposite the through hole 593 of the shower head 592. The gas injection plate 594 may include a metal material.

The support part 596 supports the side parts of the shower head 592 and the gas injection plate 594. A top end of the support part 596 is connected to the top surface of the housing 510, and a bottom end is connected to a side of the shower head 592 and the gas injection plate 594. The support part 596 may include a non-metallic material.

Figure 3:
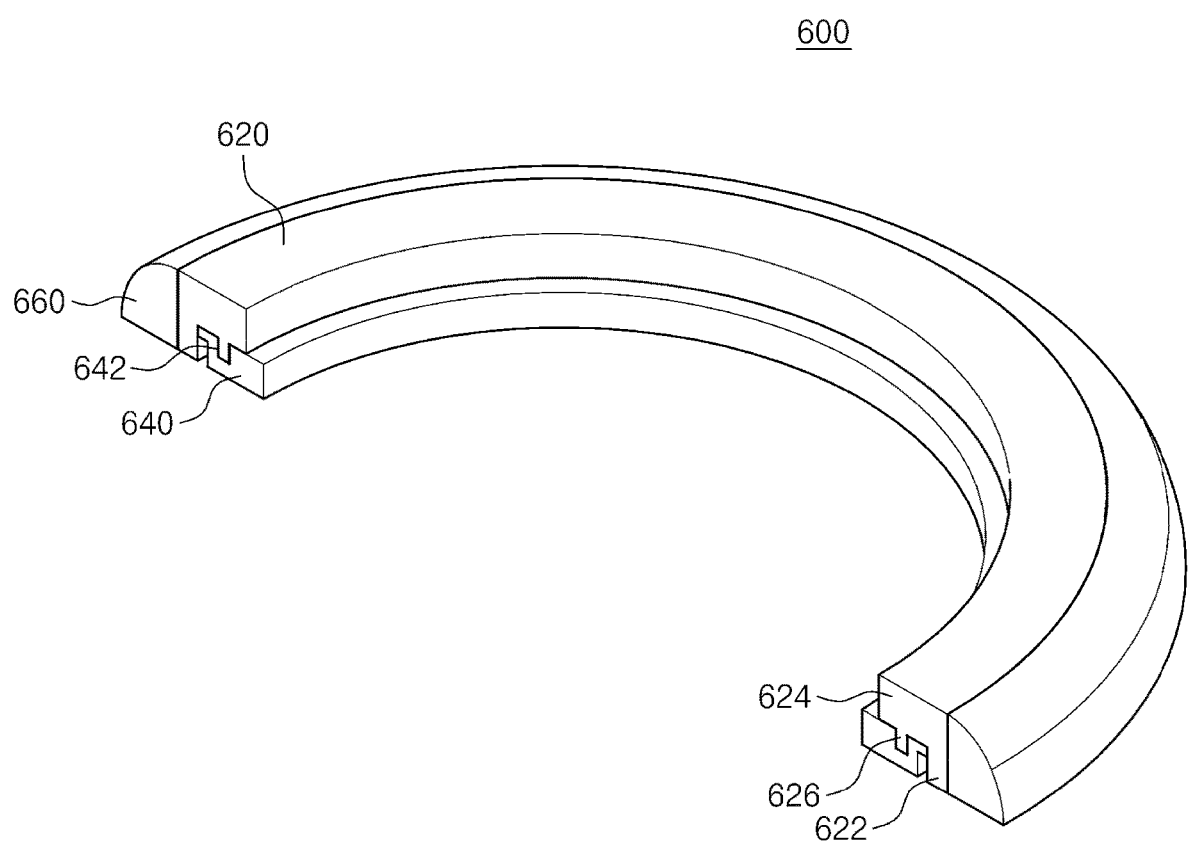
FIG. 3 is a cutting perspective view schematically illustrating a ring member of FIG. 2.

FIG. 3 is a cutting perspective view schematically illustrating a ring member of FIG. 2. Hereinafter, the ring member will be described in detail with reference to FIG. 2 and FIG. 3.

The ring member 600 is disposed at an edge area of the support unit 520. When viewed from above, the ring member 600 may have a ring shape. The ring member 600 allows plasma to be concentrated in a region facing the substrate W in the process chamber 50. The ring member 600 may include a top ring 620, a bottom ring 640, and a cover ring 660. The top ring 620 and the bottom ring 640 may be combined with each other to function as a focus ring. The focus ring may be made of a material including an Si (silicon) and a SiC (silicon carbide).

The top ring 620 may be provided in a ring shape. The top ring 620 is provided to surround a circumference of the substrate W placed on the dielectric plate 521. When viewed from above, the top ring 620 may have a ring shape. A top surface of the top ring 620 may be positioned higher than a top surface of the substrate W. Accordingly, the top ring 620 allows the plasma to be concentrated in a region facing the substrate W in the process chamber 50.

The top ring 620 may have a first part 622, a second part 624, and a third part 626. An outer surface of the first part 622 may be in surface contact with a cover ring 660 to be described later. A bottom surface of the first part 622 is provided as a surface in contact with a top end of the first lift pin 732 to be described later. In addition, the bottom surface of the first part 622 is provided as a surface in contact with a temperature sensor 800 to be described later. In an embodiment, an inner end of the first part 622 is provided as a surface in contact with a top end of the first lift pin 732. When viewed from above, the inner end of the first part 622 is provided to partially overlap the first lift pin 732. The second part 624 may be formed to extend from the first part 622 toward a center of the substrate W placed on the dielectric plate 521. An inner surface of the second part 624 surrounds the circumference of the substrate W placed on the dielectric plate 521. On a bottom surface of the second part 624, a third part 626, which may be inserted into a groove 642 formed on a top surface of the bottom ring 640, may be formed downwardly protruding.

The bottom ring 640 may be provided in a ring shape. The bottom ring 640 may be provided to surround a circumference of the dielectric plate 521. The bottom ring 640 may be provided to surround a bottom surface of an edge of the substrate W placed on the dielectric plate 521 and the dielectric plate 521. The bottom ring 640 may be provided to surround an inside of the top ring 620. The bottom ring 640 may be provided to surround an inner surface of the first part 622 of the top ring 620. An outer surface of the bottom ring 640 may be stepped. Since the outer surface of the bottom ring 640 is stepped, when the top ring 620 is lifted and lowered by a first lift pin 732 to be described later, the bottom ring 640 may be combined with the top ring 620 to form an insertion space defining a lifting/lowering limit of the first lift pin 732. The insertion space may be defined as a lifting/lowering limit groove. A groove 642 into which the third part 626 of the top ring 620 may be inserted may be formed on the top surface of the bottom ring 640. The top ring 620 and the bottom ring 640 may be combined with each other to surround the dielectric plate 521 and the substrate W placed on the dielectric plate 521.

The cover ring 660 may be made of an insulator material such as quartz. The cover ring 660 may be provided in a ring shape. The cover ring 660 may be provided to surround the top ring 620. The cover ring 660 may be provided to surround the outer surface of the top ring 620. A bottom surface of the cover ring 660 may be in surface contact with a top surface of an edge of the dielectric plate 521. Since the cover ring 660 is provided to surround the top ring 620, a part of the top ring 620 exposed to a plasma may be minimized.

Figure 4:
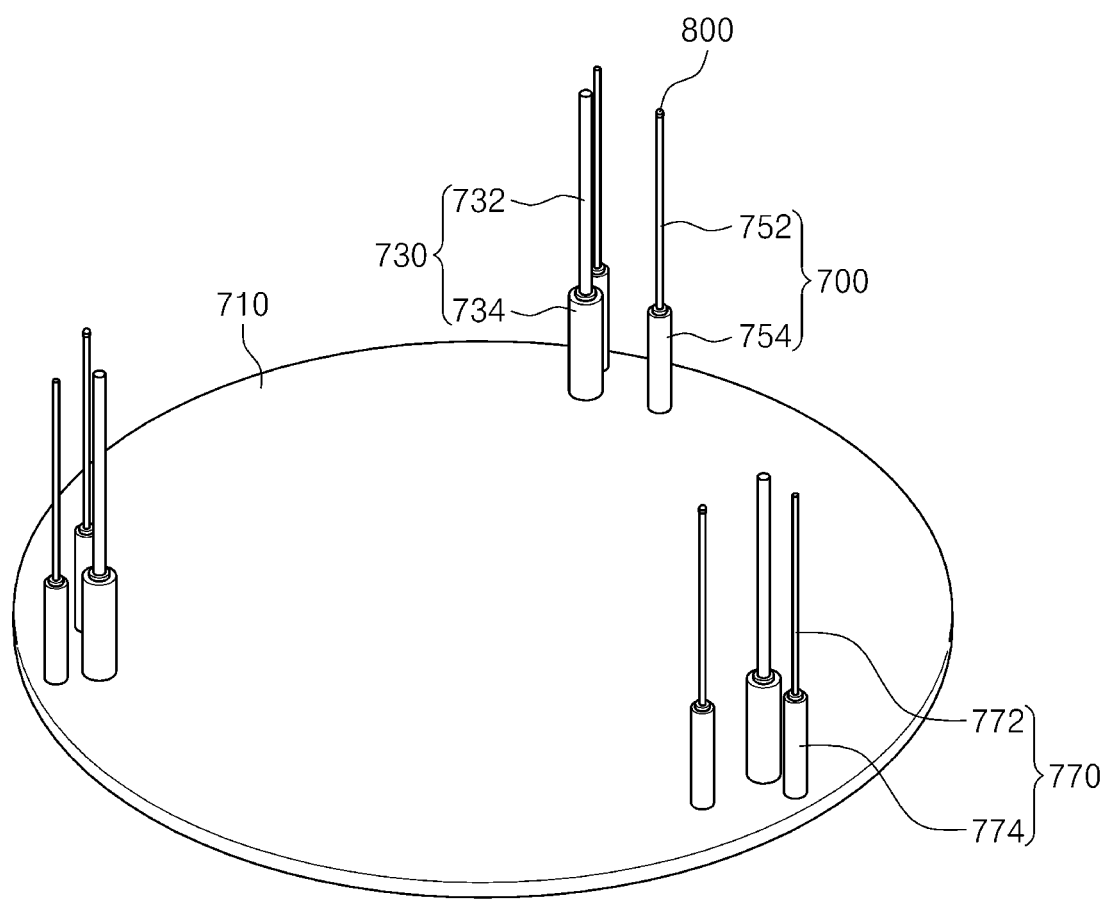
FIG. 4 is a perspective view schematically illustrating a lifting/lowering member of FIG. 2.
Figure 5:
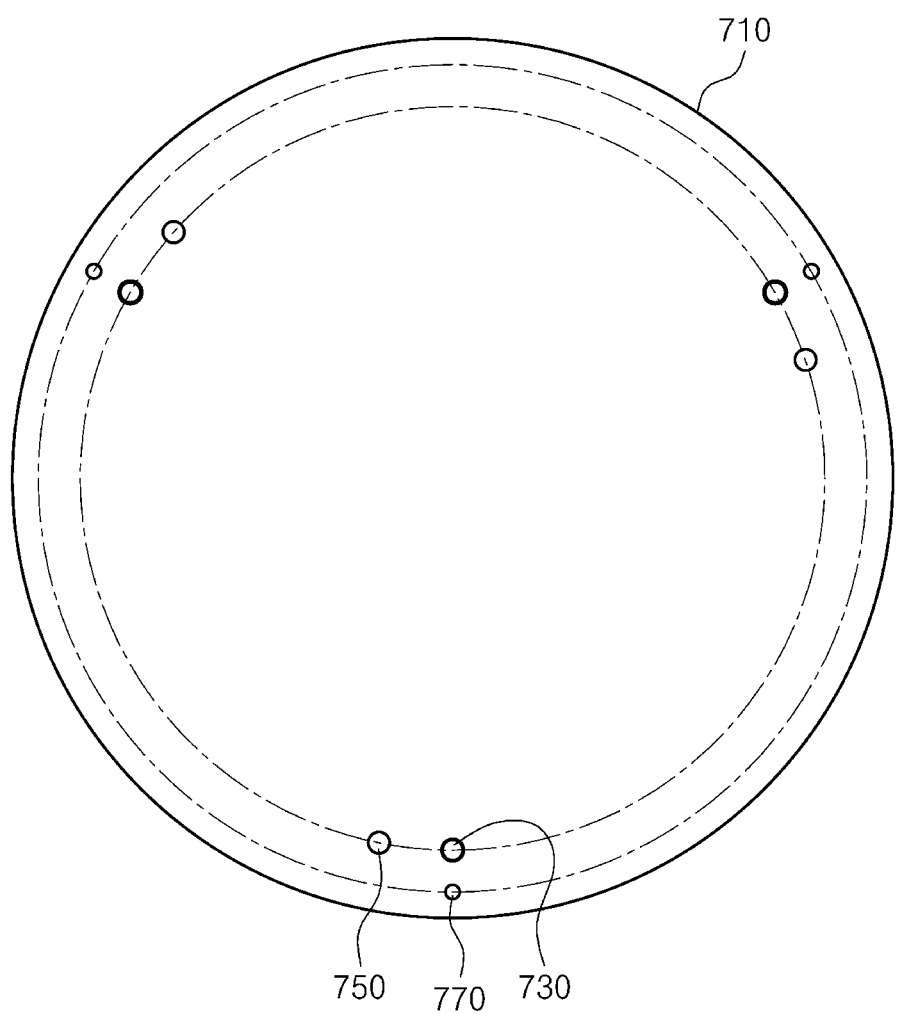
FIG. 5 schematically illustrates the lifting/lowering member of FIG. 2 viewed from above.

FIG. 4 is a perspective view schematically illustrating a lifting/lowering member of FIG. 2. FIG. 5 schematically illustrates a state in which the lifting/lowering member of FIG. 2 is viewed from above. Referring to FIG. 4 and FIG. 5, the lifting/lowering member 700 may lift and lower the ring member 600 and a temperature sensor 800 to be described later. The lifting/lowering member 700 may be located in an inner space of a bottom body 524. The lifting/lowering member 700 may include a base plate 710, a first lifting/lowering member 730, a second lifting/lowering member 750, and a third lifting/lowering member 770.

The base plate 710 may be provided in a substantially circular shape. The base plate 710 may be provided with a first lifting/lowering member 730, a second lifting/lowering member 750, and a third lifting/lowering member 770.

The first lifting/lowering member 730 may include a first lift pin 732 and a first driving unit 734. The first lift pin 732 may move in an up/down direction along a pin hole formed at a dielectric plate 521, an electrode plate 522, and/or an insulating plate 523. A plurality of first lift pins 732 may be provided. In an embodiment, three first lift pins 732 may be provided. A plurality of first lift pins 732 may share a center of a base plate 710 when viewed from above and may be formed to have a same radius. A plurality of first lift pins 732 may be positioned on a first circumference. When viewed from above, the first lift pin 732 may be disposed so as not to overlap the heater 526 and a top fluid channel 527.

The first driving unit 734 may move the first lift pin 732 in the up/down direction. The first driving unit 734 may be provided in a number corresponding to the first lift pin 732. A plurality of first driving units 734 may be provided. In an embodiment, three first driving units 734 may be provided. The first driving unit 734 may be a cylinder or a motor using a pneumatic or a hydraulic pressure. However, the inventive concept is not limited thereto, and the first driving unit 734 may be transformed into various known devices capable of providing driving force. Hereinafter, a case in which three first lift pins 732 and three first driving units 734 are provided will be described as an example.

The first lift pin 732 may lift and lower the lifting/lowering member 700. The first lift pin 732 may lift and lower the top ring 620. A top end of the first lift pin 732 may be in contact with a bottom surface of the top ring 620. The top end of the first lift pin 732 may contact a bottom surface of the first part 622 of the top ring 620. In an embodiment, a part of the top end of the first lift pin 732 may be in contact with an inner end of the first part 622. When viewed from above, the inner end of the first part 622 may be provided to overlap a part of the first lift pin 732. The first lift pin 732 may be inserted into an insertion space formed by combining the top ring 620 and the bottom ring 640 with each other. A side surface of the first lift pin 732 may have a same surface as a stepped surface of the bottom ring 640. The side surface of the first lift pin 732 may form a same surface as an inner surface of the insertion space. The first lift pin 732 may be lifted and lowered to a top end of the insertion space.

The second lifting/lowering member 750 may include a second lift pin 752 and a second driving unit 754. The second lift pin 752 may move in the up/down direction along a pin hole formed at the dielectric plate 521, the electrode plate 522, and/or the insulating plate 523. A plurality of second lift pins 752 may be provided. In an embodiment, three second lift pins 752 may be provided. A plurality of second lift pins 752 may share a center of the base plate 710 and may be formed to have a same radius as each other when viewed from above. The plurality of second lift pins 752 may be positioned on a first circumference. In an embodiment, the plurality of first lift pins 732 and the plurality of second lift pins 752 may be disposed on a same circumference. When viewed from above, the second lift pin 752 may be disposed so as not to overlap the heater 526 and the top fluid channel 527.

The second driving unit 754 may move the second lift pin 752 in the up/down direction. The second driving unit 754 may be provided in a number corresponding to the second lift pin 752. A plurality of second driving units 754 may be provided. In an embodiment, three second driving units 754 may be provided. The second driving unit 754 may be a cylinder or a motor using a pneumatic or a hydraulic pressure. However, the inventive concept is not limited thereto, and the second driving unit 754 may be transformed into various known devices capable of providing a driving force. Hereinafter, a case in which three second lift pins 752 and three second driving units 754 are provided will be described as an example.

A top end of the second lift pin 752 may be in contact with a bottom surface of the top ring 620. The top end of the second lift pin 752 may contact a bottom surface of the first part 622 of the top ring 620. In an embodiment, a part of the top end of the second lift pin 752 may be in contact with an inner end of the first part 622. When viewed from above, the inner end of the first part 622 may be provided to overlap a part of the second lift pin 752. The second lift pin 752 may be inserted into an insertion space formed by combining the top ring 620 and the bottom ring 640 with each other. A side surface of the second lift pin 752 may have a surface as the stepped surface of the bottom ring 640. The side surface of the second lift pin 752 may form a same surface as the inner side surface of the insertion space. The second lift pin 752 may be lifted and lowered to a top end of the insertion space.

The second lift pin 752 may be provided with a temperature sensor 800. In an embodiment, the temperature sensor 800 may be provided at a top end of the second lift pin 752. The second lift pin 752 may lift and lower the temperature sensor 800. As the second lift pin 752 is lifted and lowered, the second temperature sensor 800 may be lifted and lowered. The temperature sensor 800 may measure a temperature of the top ring 620. The temperature sensor 800 may measure a temperature of the bottom surface of the top ring 620. The temperature sensor 800 may be in contact with the inner end of the first part 622 to measure the temperature of the top ring 620.

A third lifting/lowering member 770 may include a third lift pin 772 and a third driving unit 774. The third lift pin 772 may move in a top/down direction along a pin hole formed in the dielectric plate 521, the electrode plate 522, and/or the insulating plate 523. The third lift pin 772 may lift and lower the cover ring. A top end of the third lift pin 772 may be in contact with a bottom surface of the cover ring 660. A plurality of third lift pins 772 may be provided. In an embodiment, three third lift pins 772 may be provided. The plurality of third lift pins 772 may share a center of the base plate 710 when viewed from above and may be formed to have a same radius. The plurality of third lift pins 772 may be positioned at a second circumference. The plurality of third lift pins 772 may be disposed on different circumferences from the first lift pins 732 and the second lift pins 752. In an embodiment, a first circumference may be provided with a smaller radius than a second circumference. When viewed from above, the third lift pin 772 may be disposed so as not to overlap the heater 526 and the top fluid channel 527.

The third driving unit 774 may move the third lift pin 772 in the up/down direction. The third driving unit 774 may be provided in a number corresponding to the third lift pin 772. A plurality of third driving units 774 may be provided. In an embodiment, three third driving units 774 may be provided. The third driving unit 774 may be a cylinder or a motor using a pneumatic or a hydraulic pressure. However, the inventive concept is not limited thereto, and the third driving unit 774 may be transformed into various known devices capable of providing a driving force.

Figure 6:
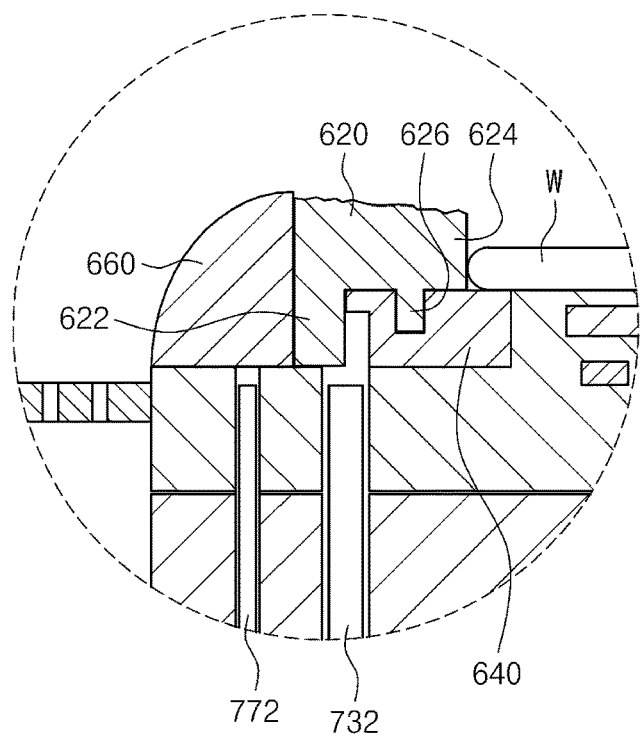
FIG. 6 is an enlarged view of part A of FIG. 2.
Figure 7:
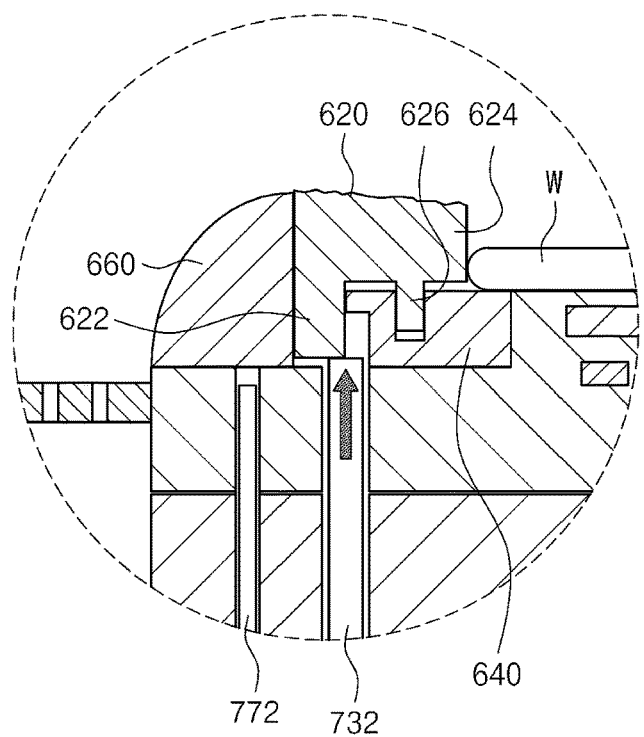
FIG. 7 is an enlarged view of part A of FIG. 2 to illustrate a state in which a top ring is lifted and lowered.

FIG. 6 is an enlarged view of part A of FIG. 2. FIG. 7 is an enlarged view of part A of FIG. 2 to illustrate a state in which a top ring is lifted and lowered. Referring to FIG. 6 and FIG. 7, a situation of a lifting/lowering member being controlled by the controller according to an embodiment of the inventive concept will be described in detail.

The controller 900 may control the lifting/lowering member 700. The controller 900 may control a first lift pin 732, a second lift pin 752, and a third lift pin 772. The controller 900 may collect a data on a temperature of a top ring 620 measured by a temperature sensor 800. The controller 900 may calculate an etching degree of the top ring 620 based on a temperature data of the top ring 620. The top ring 620 may be continuously exposed to a plasma and etched. Accordingly, a thickness of the top ring 620 may decrease. As the thickness of the top ring 620 decreases, a thermal resistance decreases. As the thickness of the top ring 620 decreases, a heat transferred from a top surface to a bottom surface of the top ring 620 increases. Accordingly, the temperature of the top ring 620 increases as a whole. The temperature sensor 800 is in contact with the bottom surface of the top ring 620 to measure an increased temperature data of the top ring 620. The controller 900 calculates the etching degree of the top ring 620 based on a changed temperature data of the top ring 620. Accordingly, the controller 900 may control the first lifting/lowering member 730 so that a height of the top ring 620 is changed.

The controller 900 collects a temperature of the bottom surface of the top ring 620 measured by the temperature sensor 800 provided at a top end of the second lift pin 752. The first lift pin 732 and the second lift pin 752 continuously contact the bottom surface of the top ring 620 while a plasma treatment is in progress on the substrate W. The controller 900 continuously collects the temperature of the bottom surface of the top ring 620 from the temperature sensor 800. The controller 900 calculates the etching degree of the top ring 620 in real time based on a temperature data collected in real time. The controller 900 controls the first lift pin 732 based on the etching degree of the top ring 620 to lift and lower the top ring 620 to a predetermined height. The controller 900 controls the first lift pin 732 and the second lift pin 752 to stop the lifting and lowering of the first lift pin 732 when the first lift pin 732 contacts an insertion space.

When a top end of the first lift pin 732 contacts a top end of the insertion space, the controller 900 determines that the top ring 620 is in a use limit state. When the top end of the first lift pin 732 contacts the top end of the insertion space, the controller 900 transmits a replacement signal of the top ring 620 that may be recognized by other operators such as a sound alarm. Accordingly, the top ring 620 is no longer used and is replaced.

In an embodiment, it is defined that a temperature when the second lift pin 752 first contacts the bottom surface of the top ring 620 is T1, and the height of the top ring 620 from the ground is H1. When the temperature of the bottom surface of the top ring 620 collected by the first lift pin 732 and the second lift pin 752 in real time reaches T2, the controller 900 lifts and lowers the first lift pin 732 and the second lift pin 752 from the ground to a height of H2. In this case, T2 is a temperature higher than T1, and H2 is a height higher than H1. After repeating the above process, when the first lift pin 732 contacts the top end of the insertion space, the controller 900 controls the first lift pin 732 and the second lift pin 752 to stop the lifting and lowering.

The controller 900 may control the third lift pin 772 such that the cover ring 660 is lifted and lowered. The controller 900 may control the third lift pin 772 so that the cover ring 660 may be lifted and lowered independently of the top ring 620.

It is common for the operator to visually check and replace the etching degree of the focus ring. In an embodiment of the inventive concept, the temperature of the top ring 620 may be measured to calculate the etching degree of the top ring 620 based on a measured temperature. Based on a calculated etching amount of the top ring 620, the top ring 620 may be lifted and lowered to a height that may be reused without replacing the top ring 620. Accordingly, the replacement period of the top ring 620 may be extended, and a use limit range of the top ring 620 may be accurately determined.

In addition, the top ring 620 is a ring member 600 surrounding the substrate W, and an area exposed to a plasma is large. The bottom ring 640 coupled to an inside of the top ring 620 and the cover ring 660 coupled to an outside of the top ring 620 have a relatively smaller area exposed to the plasma than the top ring 620. For this reason, the replacement period of the top ring 620 is faster than that of the other ring members 600. Accordingly, the cover ring 660 may be independently lifted and lowered according to the etching degree of the cover ring 660 by adjusting a lifting/lowering height individually of the top ring 620. In an embodiment, when the etching degree of the cover ring 660 is relatively smaller than that of the top ring 620, the cover ring 660 may be used without a replacement. In an embodiment, when the etching degree of the cover ring 660 is relatively greater than that of the top ring 620, the cover ring 660 may be replaced separately from the top ring 620. Accordingly, by independently lifting or replacing the top ring 620 and the cover ring 660 etched by the plasma and outside an allowable range, the replacement cycle of the top ring 620 and the cover ring 660 may be extended. Since the replacement period is extended, a cost and a time required for replacement may be saved, and thus an efficiency of a substrate treatment may be increased. In addition, the top ring 620 and the cover ring 660 may be independently maintained and repaired.

In the above-described embodiment of the inventive concept, it has been described that the controller controls a plurality of first lift pins and a plurality of second lift pins to be lifted and lowered together. However, the inventive concept is not limited thereto, and each of the plurality of first lift pins and the plurality of second lift pins may be controlled to independently be lifted and lowered. In the above-described embodiment of the inventive concept, other components except for the controller 900 are similarly provided in other embodiments of the inventive concept to be described below. Accordingly, hereinafter, descriptions of similarly provided configurations will be omitted to avoid overlapping descriptions.

Figure 8:
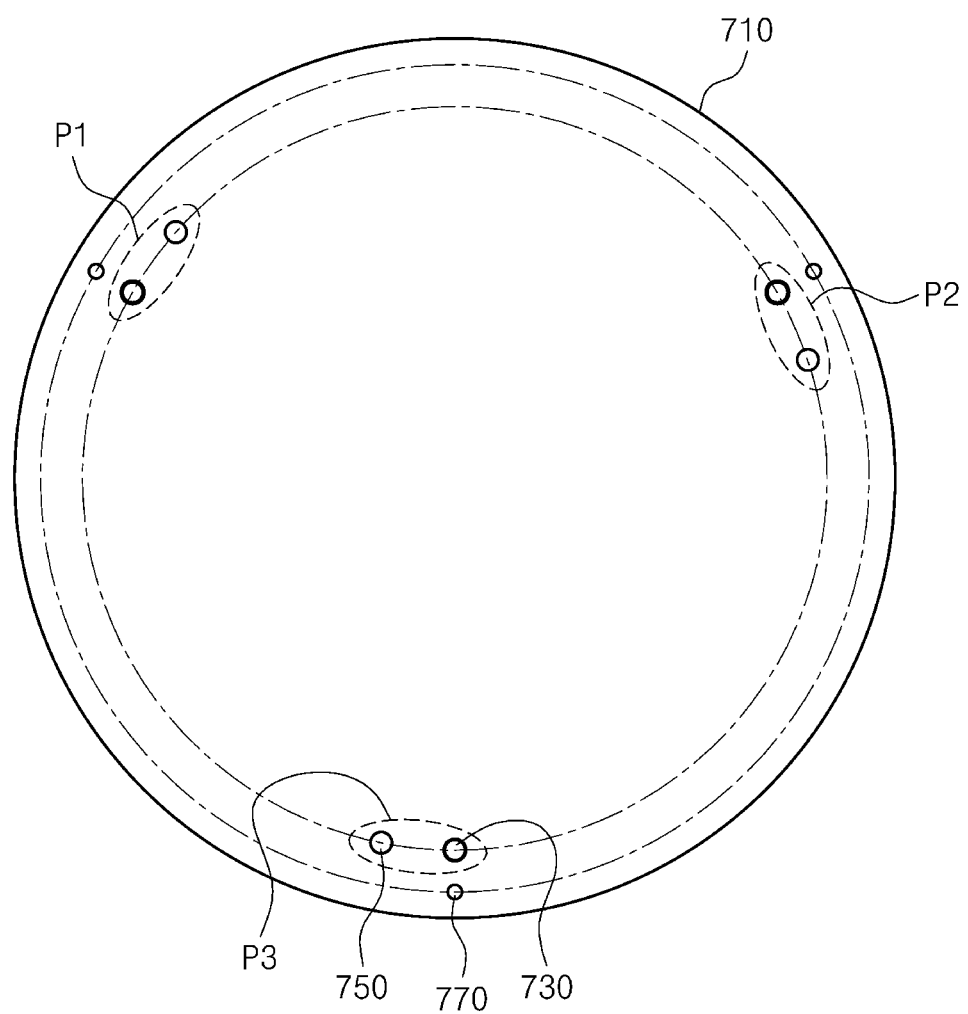
FIG. 8 illustrates a state in which a first lifting/lowering member and a second lifting/lowering member provided on a base plate of FIG. 2 are grouped.

FIG. 8 illustrates a state in which a first lifting/lowering member and a second lifting/lowering member provided on a base plate of FIG. 2 are grouped. Referring to FIG. 8, each of the first lift pins 732 and the second lift pins 752 may be defined in three groups. The first lift pins 732 and the second lift pins 752 may be provided in a same number. Each group is defined as P1, P2, and P3. P1, P2, and P3 include a first lift pin 732 and a second lift pin 752, respectively. The P1 group includes a first lift pin 732 and a second lift pin 752 adjacent thereto. The P2 group includes a first lift pin 732 different from the first lift pin 732 included in P1 and a second lift pin 752 adjacent thereto. The P3 group includes a first lift pin 732 different from the first lift pins 732 included in P1 and P2, and a second lift pin 752 adjacent thereto.

The controller 900 may control the first lift pin 732 and the second lift pin 752 included in each group to be independently lifted and lowered. The controller 900 controls the first lift pin 732 included in the P1 group to be lifted and lowered based on a temperature data of the top ring 620 measured by the temperature sensor provided at a top end of the second lift pin 752 included in the P1 group. The controller 900 controls the first lift pin 732 included in the P1 group to be lifted and lowered independently of the first lift pin 732 included in the P2 and P3 groups. The controller 900 controls the first lift pin 732 included in the P2 group and the first lift pin 732 included in the P3 group similarly to the first lift pin 732 included in the P1 group. That is, the controller 900 may control each of the first lift pins 732 to independently change a height of the top ring 620 based on the temperature data measured by the temperature sensor 800 disposed adjacent to each of the first lift pins 732 among the temperature sensors 800 provided at the top end of the plurality of second lift pins 752.

When viewed from above, a difference in the etching degree may occur along a circumference of the top ring 620. According to the present embodiment, the etching degree for each region of the top ring 620 may be determined. Accordingly, when the etching degree is different for each region of the top ring 620, the first lift pin 732 and the second lift pin 752 provided at a position corresponding to a region having a relatively greater etching degree are controlled to be independently lifted and lowered, thereby selectively lifting and lowering the top ring 620. That is, the first lift pin 732 and the second lift pin 752 belonging to P1, P2, and P3 may be controlled to be independently lifted and lowered.

In the above-described embodiment, it has been described that the temperature sensor 800 is provided to the second lift pin 752. However, the inventive concept is not limited thereto, and the temperature sensor 800 may be provided to the first lift pin 732. In an embodiment, the temperature sensor 800 may be provided at a top end of the first lift pin 732. When the first lift pin 732 changes the height of the top ring 620, the temperature sensor 800 provided on the top end of the first lift pin 732 may contact a bottom surface of the top ring 620 to measure a temperature of the top ring 620.

In the above-described embodiment, it has been described that the temperature sensor 800 is provided to the second lift pin 752. However, the inventive concept is not limited thereto, and the temperature sensor 800 may be provided on the bottom surface of the top ring 620. The temperature sensor 800 provided on the bottom surface of the top ring 620 may collect the temperature data of the top ring 620 in real time. Accordingly, the controller 900 may change the height of the top ring 620 by controlling the first lift pin 732 based on the temperature data collected by the temperature sensor 800.

In the above-described embodiment, it has been described that lift pins are provided to the first lifting/lowering member 730, the second lifting/lowering member 750, and the third lifting/lowering member 770. However, the inventive concept is not limited thereto, and the first lifting/lowering member 730, the second lifting/lowering member 750, and the third lifting/lowering member 770 may be modified to specify various known structures capable of lifting and lowering in addition to the lift pin.

Figure 9:
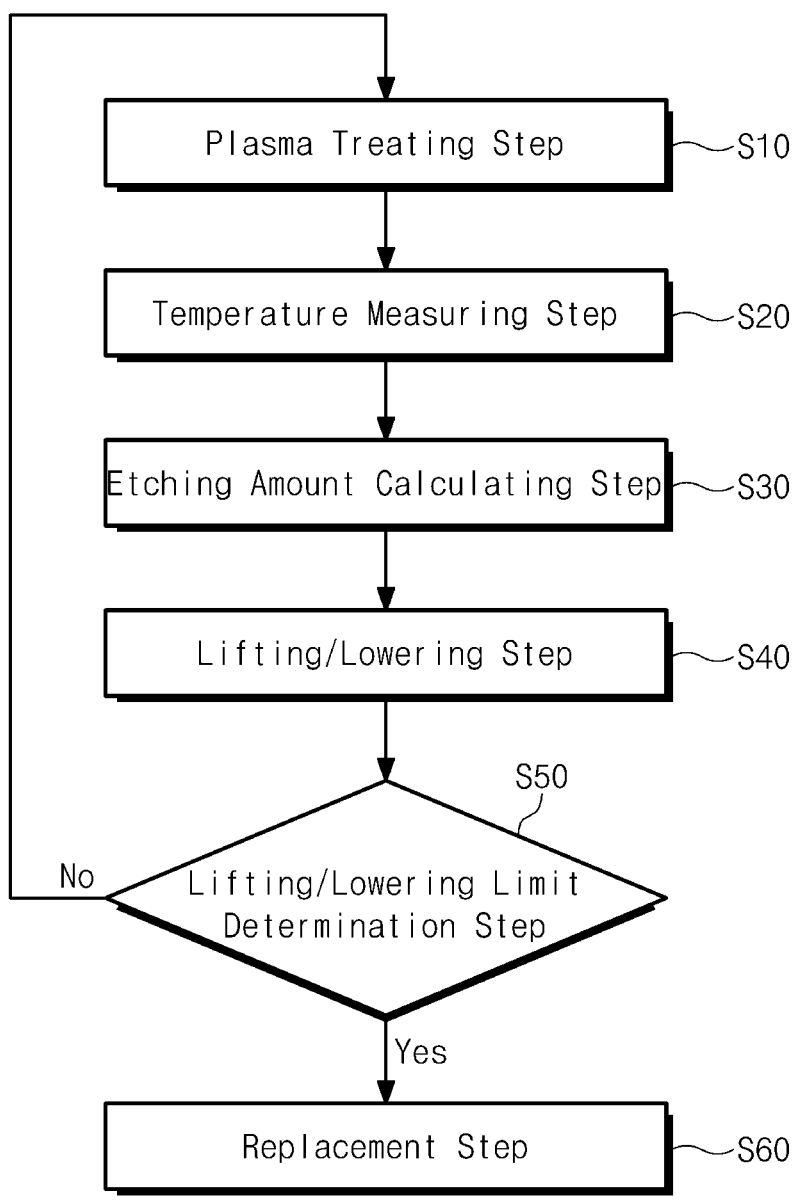
FIG. 9 is a flowchart illustrating a substrate treating method according to an embodiment of the inventive concept.

FIG. 9 is a flowchart illustrating a substrate treating method according to an embodiment of the inventive concept. Referring to FIG. 9, the substrate treatment method according to an embodiment of the inventive concept may include a plasma treating step S10, a temperature measuring step S20, an etching amount calculating step S30, a lifting/lowering step S40, a lifting/lowering limit determination step S50, and a replacement step S60.

In the plasma treating step S10, a substrate W may be seated on a top surface of a dielectric plate 521, and a plasma treatment may be performed on the substrate W. In an embodiment, the substrate W may be etched with a plasma.

In the temperature measuring step S20, a temperature of a top ring 620 surrounding a circumference of the substrate W is measured during the plasma treating step S10. A temperature measurement of the top ring 620 is performed by a temperature sensor 800. The temperature sensor 800 may be in contact with the top ring 620 to measure the temperature of the top ring 620. In an embodiment, the first lift pin 732 and the second lift pin 752 may be lifted and lowered until they contact a bottom surface of the top ring 620. The temperature sensor 800 provided at a top end of the second lift pin 752 is in contact with the bottom surface of the top ring 620 to measure the temperature data of the top ring 620.

In the etching amount calculating step S30, an etching amount of the top ring 620 is calculated based on the temperature data measured by the temperature sensor 800. The top ring 620 may be continuously exposed to a plasma and etched. Accordingly, a thickness of the top ring 620 may decrease. As the thickness of the top ring 620 decreases, a thermal resistance decreases. When the thermal resistance of the top ring 620 decreases, the temperature of the top ring 620 increases. Accordingly, an etching degree of the top ring 620 is calculated based on a changed temperature data collected by the temperature sensor 800.

In the lifting/lowering step S40, a height of the top ring 620 is changed according to the etching degree of the top ring 620 calculated in the etching amount calculating step S30. In an embodiment, the first lift pin 732 lifts and lowers the top ring 620 according to a calculated etching degree of the top ring 620. After lifting and lowering the top ring 620 to a height corresponding to a value based on the etching amount, the lifting and lowering of the top ring 620 is stopped.

In the lifting/lowering limit determination step S50, a limit height at which the top ring 620 may be lifted and lowered is determined. In an embodiment, when the first lift pin 732 does not contact a top end of the insertion space formed by combining the top ring 620 and the bottom ring 640, it may be determined that the top ring 620 may be lifted and lowered. An insertion space may be defined as a lifting/lowering limit groove. When the top ring 620 is not at a lifting/lowering limit, the plasma treating step S10, the temperature measuring step S20, the etching amount calculating step S30, and the lifting/lowering step S40 are sequentially performed.

For an example, when the first lift pin 732 contacts a top end of an insertion space formed by combining the top ring 620 and the bottom ring 640, it may be determined that the top ring 620 is at the lifting/lowering limit. When the top ring 620 is at the lifting/lowering limit, the first lift pin 732 is stopped and the operator performs a replacement step S60 of replacing the top ring 620. In the replacement step S60, a second transfer robot 340 may transfer the top ring 620. Selectively, the second transfer robot 340 may transfer the bottom ring 640 and the top ring 620 together. In addition, the first transfer robot 240 may also transfer the top ring 620. Selectively, the first transfer robot 240 may transfer the bottom ring 640 and the top ring 620 together.

In the substrate treatment method according to the present embodiment, the cover ring 660 surrounding an outside of the top ring 620 may independently perform a lifting/lowering step by a third lift pin 772. The cover ring 660 may be transferred by the second transfer robot 340. Also, the cover ring 660 may be transferred by the first transfer robot 240.

It is common for the operator to visually check the etching degree of the top ring 620 to replace it. In an embodiment of the inventive concept, the temperature of the top ring 620 may be measured to calculate the etching degree of the top ring 620 based on a measured temperature. Based on a calculated etching amount of the top ring 620, the top ring 620 may be lifted and lowered to a height that may be reused without replacing the top ring 620. Accordingly, a replacement period of the top ring 620 may be extended, and the use limit range of the top ring 620 may be accurately determined.

In addition, the top ring 620 is a ring member 600 surrounding the substrate W, and an area exposed to a plasma is large. The bottom ring 640 coupled to an inside of the top ring 620 and the cover ring 660 coupled to an outside of the top ring 620 have a relatively smaller area exposed to the plasma than the top ring 620. For this reason, the replacement period of the top ring 620 is faster than that of the other ring members 600. Accordingly, the cover ring 660 may be independently lifted and lowered according to the etching degree of the cover ring 660 by adjusting the lifting/lowering height individually of the top ring 620. In an embodiment, when the etching degree of the cover ring 660 is relatively smaller than that of the top ring 620, the cover ring 660 may be used without a replacement. In an embodiment, when the etching degree of the cover ring 660 is relatively greater than that of the top ring 620, the cover ring 660 may be replaced separately from the top ring 620. Accordingly, by independently lifting or replacing the top ring 620 and the cover ring 660 etched by the plasma and outside the allowable range, the replacement cycle of the top ring 620 and the cover ring 660 may be extended. Since the replacement period is extended, a cost and a time required for the replacement may be saved, and thus an efficiency of a substrate treatment may be increased. In addition, the top ring 620 and the cover ring 660 may be independently maintained and repaired.

The effects of the inventive concept are not limited to the above-mentioned effects, and the unmentioned effects can be clearly understood by those skilled in the art to which the inventive concept pertains from the specification and the accompanying drawings.

Although the embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating apparatus comprising:
   a housing having a treating space for treating a substrate;
   a support unit supporting the substrate at the treating space;
   a gas supply unit supplying a process gas into the treating space; and
   a plasma source generating a plasma from the process gas, and
   wherein the support unit comprises:
   a dielectric plate having a top surface to place the substrate thereon;
   a top ring surrounding a circumference of the substrate placed on the dielectric plate;
   a temperature sensor measuring a temperature of the top ring;
   a first lifting/lowering member lifting or lowering the top ring;
   a bottom ring surrounding a bottom surface of an edge of the substrate placed on the dielectric plate, the dielectric plate, and an inside of the top ring, and
   a controller, and
   wherein the bottom ring is combined with the top ring to form an insertion space defining a lifting/lowering limit of the first lifting/lowering member therein, when the top ring is lifted or lowered by the first lifting/lowering member, and
   wherein the controller controls the first lifting/lowering member to change a height of the top ring according to an etching amount of the top ring calculated based on the temperature of the top ring measured by the temperature sensor.

2. The substrate treating apparatus of claim 1,
   wherein the support unit further comprises a second lifting/lowering member lifting or lowering the temperature sensor, and
   wherein the controller controls each of the first lifting/lowering member and the second lifting/lowering member so that the top ring and the temperature sensor are lifted/lowered to a same height.

3. The substrate treating apparatus of claim 2,
   wherein the first lifting/lowering member comprises a plurality of first lift pins,
   wherein each first lift pin of the plurality of first lift pins is driven independently by a respective motor,
   wherein the temperature sensor is provided in plural,
   wherein a number of the plurality of temperature sensors is the same as a number of the plurality of first lift pins, and
   wherein the controller controls each first lift pin of the plurality of first lift pins to change the height of the top ring independently based on a measured value of a corresponding temperature sensor of the plurality of temperature sensors, which is disposed adjacent to each first lift pin among the plurality of first lift pins.

4. The substrate treating apparatus of claim 3,
wherein the second lifting/lowering member comprises a plurality of second lift pins, and
wherein each temperature sensor of the plurality of temperature sensors is provided at a top end of a corresponding second lift pin of the plurality of second lift pins.

5. The substrate treating apparatus of claim 1,
wherein the first lifting/lowering member comprises a plurality of first lift pins,
wherein the temperature sensor is provided in plural,
wherein a number of the plurality of temperature sensors is the same as a number of the plurality of first lift pins, and
wherein each temperature sensor of the plurality of temperature sensors is provided at a top end of a corresponding first lift pin of the plurality of first lift pins, and measures the temperature of the bottom surface of the top ring.

6. The substrate treating apparatus of claim 1,
wherein the support unit comprises:
a cover ring surrounding an outside of the top ring; and
a third lifting/lowering member lifting/lowering the cover ring, and
wherein the controller controls the third lifting/lowering member to lift or lower the cover ring independently of the top ring.

7. A support unit supporting a substrate at a treating space for plasma treating the substrate, the support unit comprising:
a dielectric plate having a top surface to place the substrate thereon;
a top ring surrounding a circumference of the substrate placed on the dielectric plate;
a temperature sensor measuring a temperature of the top ring;
a first lifting/lowering member lifting/lowering the top ring;
a bottom ring surrounding a bottom surface of an edge of the substrate placed on the dielectric plate, the dielectric plate, and an inside of the top ring, and
a controller controlling the first lifting/lowering member, and
wherein the bottom ring is combined with the top ring to form an insertion space defining a lifting/lowering limit of the first lifting/lowering member therein, when the top ring is lifted or lowered by the first lifting/lowering member, and
wherein the controller controls the first lifting/lowering member to change a height of the top ring according to an etching amount of the top ring calculated based on the temperature of the top ring measured at the temperature sensor.

8. The support unit of claim 7 further comprises:
a second lifting/lowering member lifting or lowering the temperature sensor, and
wherein the controller controls each of the first lifting/lowering member and the second lifting/lowering member to lift or lower the top ring and the temperature sensor to a same height.

9. The support unit of claim 8,
wherein the first lifting/lowering member comprises a plurality of first lift pins,
wherein each first lift pin of the plurality of first lift pins is driven independently by a respective motor,
wherein the temperature sensor is provided in plural,
wherein a number of the plurality of temperature sensors is the same as a number of the plurality of first lift pins, and
wherein the controller controls each first lift pin among the plurality of first lift pins to change the height of the top ring independently based on a measured value of a corresponding temperature sensor among the plurality of temperature sensors, which is disposed adjacent to each first lift pin among the plurality of first lift pins.

10. The support unit of claim 9,
wherein the second lifting/lowering member comprises a plurality of second lift pins, and
wherein each temperature sensor among the plurality of temperature sensors is provided at a top end of a corresponding second lift pin among the plurality of second lift pins.

11. The support unit of claim 7,
wherein the first lifting/lowering member comprises a plurality of first lift pins,
wherein the temperature sensor is provided in plural, and
wherein each temperature sensor of the plurality of temperature sensors is provided at a top end of a corresponding first lift pin among the plurality of first lift pin, and measures the temperature of the bottom surface of the top ring.

12. The support unit of claim 11,
wherein each first lift pin of the plurality of first lift pins is driven by a respective motor, and
wherein the controller independently controls a height of each first lift pin among the plurality of first lift pins.

13. The support unit of claim 7 further comprising:
a cover ring surrounding an outside of the top ring; and
a third lifting/lowering member lifting or lowering the cover ring, and
wherein the controller controls the third lifting/lowering member to lift or lower the cover ring independently of the top ring.

14. A substrate treating apparatus comprising:
a housing having a treating space for treating a substrate;
a support unit supporting the substrate at the treating space;
a gas supply unit supplying a process gas into the treating space; and
a plasma source generating a plasma from the process gas, and
wherein the support unit comprises:
a dielectric plate having a top surface to place the substrate thereon;
a top ring surrounding a circumference of the substrate placed on the dielectric plate;
a first lifting/lowering member lifting or lowering the top ring, and
a bottom ring surrounding a bottom surface of an edge of the substrate placed on the dielectric plate, the dielectric plate, and an inside of the top ring, and
wherein the bottom ring is combined with the top ring to form an insertion space defining a lifting/lowering limit of the first lifting/lowering member therein, when the top ring is lifted or lowered by the first lifting/lowering member.

15. The substrate treating apparatus of claim 14,
wherein the support unit comprises:
a cover ring surrounding an outside of the top ring; and
a third lifting/lowering member lifting/lowering the cover ring.

* * * * *